(12) United States Patent
Aburatani et al.

(10) Patent No.: US 9,082,797 B2
(45) Date of Patent: Jul. 14, 2015

(54) SUBSTRATE PROCESSING APPARATUS AND METHOD OF MANUFACTURING SEMICONDUCTOR DEVICE

(75) Inventors: Yukinori Aburatani, Toyama (JP); Toshiya Shimada, Toyama (JP); Kenji Shinozaki, Toyama (JP); Tomihiro Amano, Toyama (JP); Hiroshi Ashihara, Toyama (JP); Hidehiro Yanai, Toyama (JP); Masahiro Miyake, Toyama (JP); Shin Hiyama, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 297 days.

(21) Appl. No.: 13/536,128

(22) Filed: Jun. 28, 2012

(65) Prior Publication Data

US 2013/0012035 A1 Jan. 10, 2013

(30) Foreign Application Priority Data

Jul. 1, 2011 (JP) .................................. 2011-147105
Jun. 25, 2012 (JP) .................................. 2012-141686

(51) Int. Cl.
*H01L 21/67* (2006.01)
*H05B 3/08* (2006.01)
(Continued)

(52) U.S. Cl.
CPC ............ *H01L 21/67115* (2013.01); *F27B 5/14* (2013.01); *H01L 21/324* (2013.01);
(Continued)

(58) Field of Classification Search
CPC ...... H05B 3/0047; H05B 3/08; H01L 21/324; H01L 21/67115; C23C 16/481; F27B 5/04; F27B 17/0025; F27B 2005/062; F27B 2005/068; F27B 2005/14; F27D 1/00; F27D 1/02; F27D 99/0001; F27D 99/0006; F27D 2009/0056; F27D 2009/0062; H01K 1/18; H01K 1/20; H01K 1/22; H01K 1/58
See application file for complete search history.

(56) References Cited

U.S. PATENT DOCUMENTS 6,393,209 B2 * 5/2002 Kimura .......................... 392/407
6,947,665 B2 * 9/2005 Garmer et al. ................ 392/411
(Continued)

FOREIGN PATENT DOCUMENTS

| JP | 2000-306857 | 11/2000 |
|----|-------------|---------|
| JP | 2002-261037 | 9/2002 |

(Continued)

OTHER PUBLICATIONS

Office Action in corresponding Korean Application No. 10-2012-0070581, dated Jan. 23, 2014, along with an English translation.
(Continued)

*Primary Examiner* — Joseph M Pelham
(74) *Attorney, Agent, or Firm* — Edell, Shapiro & Finnan LLC

(57) ABSTRACT

A substrate processing apparatus capable of increasing the life span of a lamp for heating a substrate is provided. The substrate processing apparatus includes: a light receiving chamber for processing a substrate; a substrate support unit inside the light receiving chamber; a lamp including an electrical wire, and a seal accommodating the electrical wire to hermetically seal the lamp with a gas therein, the lamp irradiating the substrate with a light; a lamp receiving unit outside the light receiving chamber to accommodate the lamp therein, the lamp receiving unit including a lamp connector connected to the lamp to supply an electric current through the electrical wire, a heat absorption member including a material having a thermal conductivity higher than that of the seal, and a base member fixing the heat absorption member; and an external electrical wire connected to the lamp connector to supply current to the lamp connector.

12 Claims, 13 Drawing Sheets

(51) Int. Cl.
  *H05B 3/00* (2006.01)
  *F27B 5/14* (2006.01)
  *H01L 21/324* (2006.01)
  *C23C 16/48* (2006.01)
  *F27B 17/00* (2006.01)
  *F27D 9/00* (2006.01)

(52) U.S. Cl.
  CPC ........... *H05B3/0047* (2013.01); *H05B 3/08* (2013.01); *C23C 16/481* (2013.01); *F27B 17/0025* (2013.01); *F27D 2009/0056* (2013.01)

(56) References Cited

U.S. PATENT DOCUMENTS

| | | | |
|---|---|---|---|
| 7,075,037 B2 * | 7/2006 | Shimizu et al. | 219/390 |
| 7,147,359 B2 * | 12/2006 | Ranish et al. | 362/652 |
| 7,522,822 B2 * | 4/2009 | Trujillo et al. | 392/416 |
| 7,612,491 B2 * | 11/2009 | Ranish et al. | 313/318.08 |
| 7,629,557 B2 * | 12/2009 | Shimizu | 219/390 |
| 8,294,068 B2 * | 10/2012 | Ranish et al. | 219/395 |
| RE44,712 E * | 1/2014 | Ranish et al. | 313/318.08 |
| 2002/0150395 A1 * | 10/2002 | Shimizu et al. | 392/418 |
| 2004/0156625 A1 * | 8/2004 | Garmer et al. | 392/411 |
| 2005/0286243 A1 * | 12/2005 | Ranish et al. | 362/89 |
| 2006/0066193 A1 * | 3/2006 | Ranish et al. | 313/116 |
| 2006/0102612 A1 * | 5/2006 | Shimizu | 219/390 |
| 2008/0199162 A1 * | 8/2008 | Ranish et al. | 392/407 |
| 2008/0199163 A1 * | 8/2008 | Ranish et al. | 392/407 |
| 2010/0059497 A1 * | 3/2010 | Ranish et al. | 219/395 |

FOREIGN PATENT DOCUMENTS

| | | |
|---|---|---|
| JP | 2009088347 | 4/2009 |
| TW | 200845105 A | 11/2008 |
| TW | 200949950 A | 12/2009 |

OTHER PUBLICATIONS

Office Action in corresponding Korean Application No. 10-2012-0070581, dated Jun. 12, 2013, along with an English translation.
Office Action in corresponding Taiwan Application No. 101123387, dated Sep. 14, 2014, along with an English translation.

* cited by examiner

SUBSTRATE PROCESSING APPARATUS AND METHOD OF MANUFACTURING SEMICONDUCTOR DEVICE

CROSS-REFERENCE TO RELATED APPLICATIONS

This application claims priority to and the benefit of Japanese Patent Application Nos. 2012-141686 filed on Jun. 25, 2012 and 2011-147105 filed on Jul. 1, 2011, the disclosures of which are incorporated herein by reference.

FIELD OF THE INVENTION

The present invention relates to a substrate processing apparatus, which is an apparatus for manufacturing a semiconductor device, for example, a semiconductor integrated circuit device (hereinafter referred to as an "IC"); and more particularly, to a substrate processing apparatus configured to process a semiconductor substrate (for example, a semiconductor wafer), in which a semiconductor integrated circuit is manufactured, by heating the semiconductor substrate; and a method of manufacturing a semiconductor device using the substrate processing apparatus.

DESCRIPTION OF THE RELATED ART

When a semiconductor device is manufactured, various treatments are carried out by exposing a semiconductor substrate (wafer) heated to a desired temperature to a gas. In a single-type substrate processing apparatus in which substrates are processed one by one, a substrate is heated using a heater installed inside a substrate support unit configured to support the substrate, or a lamp heating mechanism disposed to face a substrate support surface of the substrate support unit. As the substrate processing apparatus configured to process the substrate by heating, an apparatus as described in Patent Document 1, for example, is known in the art.

PRIOR-ART DOCUMENT

Japanese Patent Laid-open Publication No. 2009-88347

SUMMARY OF THE INVENTION

However, when a substrate is heated using a conventional lamp heating mechanism, a sealing part of a lamp may be heated by light from the lamp, reducing the life span of the lamp. Therefore, the present invention aims to provide a substrate processing apparatus capable of increasing the life span of the lamp configured to heat the substrate, or a method of manufacturing a semiconductor device using the substrate processing apparatus.

A substrate processing apparatus according to the present invention to solve the problems is configured as follows. That is, the substrate processing apparatus includes:

a light receiving chamber configured to process a substrate;

a substrate support unit disposed inside the light receiving chamber to support the substrate;

a lamp including a lamp electrical wire, and a sealing part accommodating the lamp electrical wire therein to hermetically seal the lamp with a gas therein, the lamp being configured to irradiate the substrate supported by the substrate support unit with a light;

a lamp receiving unit disposed outside the light receiving chamber to accommodate the lamp therein, the lamp receiving unit including a lamp connection member connected to the lamp to supply an electric current through the lamp electrical wire, a heat absorption member including a material having a thermal conductivity higher than that of the sealing part to cover the sealing part with the sealing part being in contact, and a base member fixing the heat absorption member with the heat absorption member being in contact; and an external electrical wire connected to the lamp connection member to supply an electric current to the lamp connection member.

Also, a method of manufacturing a semiconductor device according to the present invention is configured as follows. That is, a method of manufacturing a semiconductor device uses a substrate processing apparatus including: a light receiving chamber configured to process a substrate; a substrate support unit disposed inside the light receiving chamber to support the substrate; a lamp including a lamp electrical wire, and a sealing part accommodating the lamp electrical wire therein to hermetically seal the lamp with a gas therein, the lamp being configured to irradiate the substrate supported by the substrate support unit with a light; a lamp receiving unit disposed outside the light receiving chamber to accommodate the lamp therein, the lamp receiving unit including a lamp connection member connected to the lamp to supply an electric current through the lamp electrical wire, a heat absorption member including a material having a thermal conductivity higher than that of the sealing part to cover the sealing part with the sealing part being in contact, and a base member fixing the heat absorption member with the heat absorption member being in contact; and an external electrical wire connected to the lamp connection member to supply an electric current to the lamp connection member.

The method includes:

loading the substrate into the light receiving chamber to be supported by the substrate support unit;

irradiating the substrate supported by the substrate support unit with the light from the lamp; and unloading the substrate from inside the light receiving chamber.

BRIEF DESCRIPTION OF THE DRAWINGS

FIG. 11 is a diagram illustrating a method of transferring a substrate in a processing chamber 16a.

FIG. 12 is a diagram illustrating a method of transferring a substrate in the processing chamber 16a.

FIG. 13 is a diagram illustrating a method of transferring a substrate in the processing chamber 16a.

DETAILED DESCRIPTION

In this embodiment, one example of a substrate processing apparatus is configured as a semiconductor manufacturing apparatus for performing a processing process in a method of manufacturing a semiconductor device (IC). Hereinafter, an embodiment of the present invention will be described with reference to the drawings.

(Configuration of Substrate Processing Apparatus)

Figure 1:
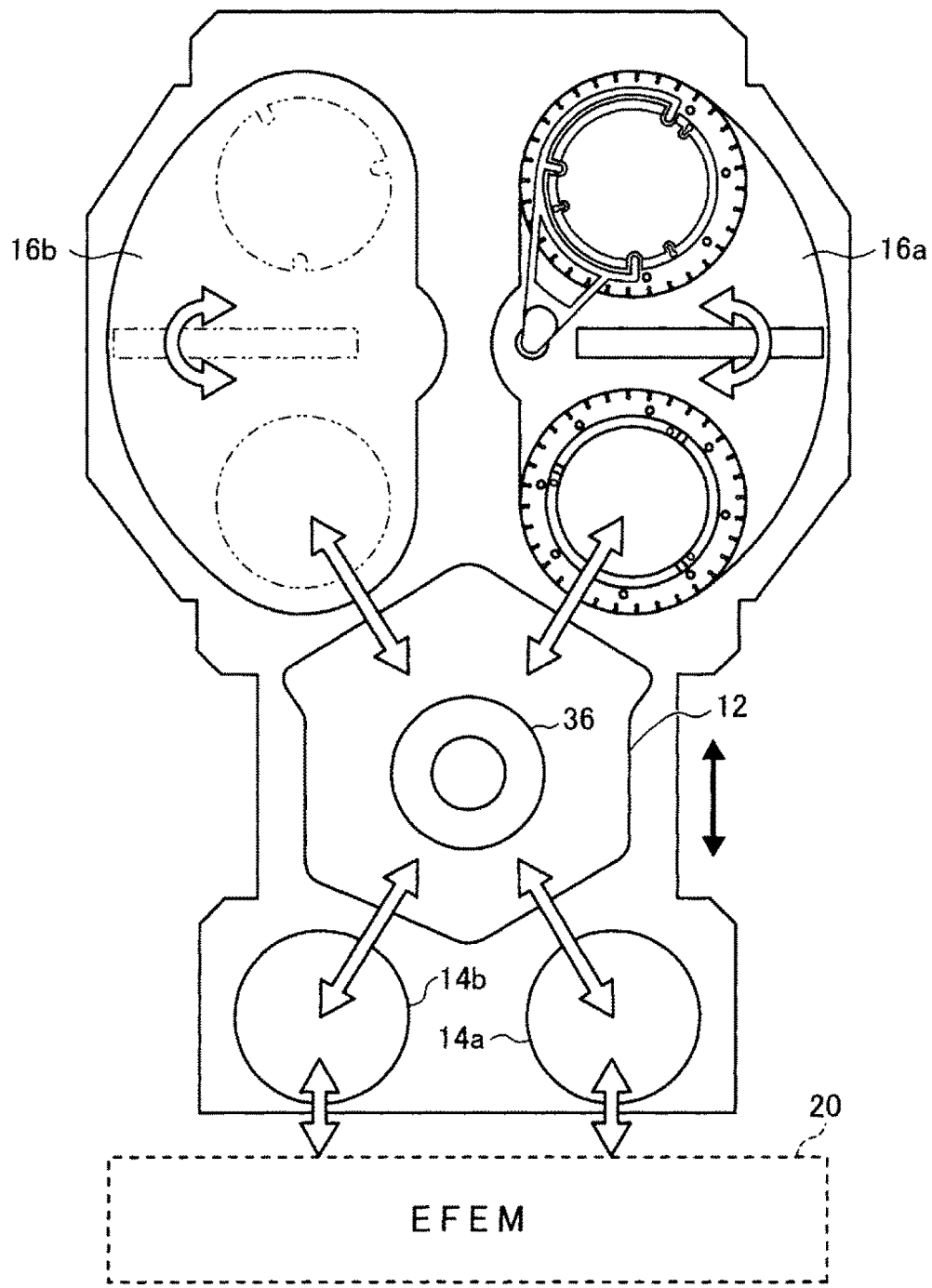
FIG. 1 is a top view showing an outline of a substrate processing apparatus according to an embodiment of the present invention.
Figure 2:
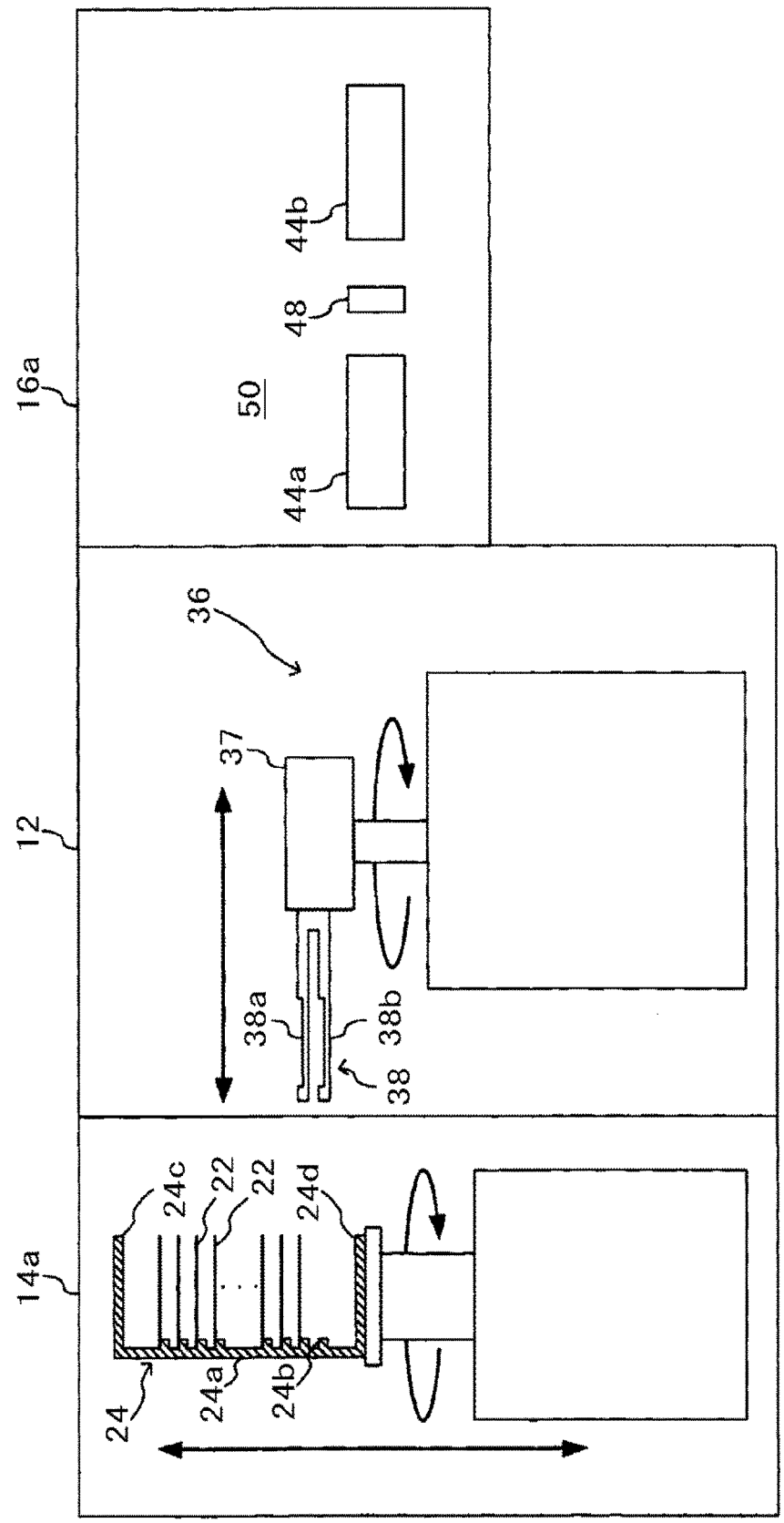
FIG. 2 is a side view showing an outline from a load lock chamber to a processing chamber of the substrate processing apparatus according to an embodiment of the present invention.

FIG. 1, an overall configuration diagram of a substrate processing apparatus 10 according to an embodiment of the present invention, is also a conceptual diagram of the substrate processing apparatus 10 viewed from the top. FIG. 2 is a side view showing an outline of the substrate processing apparatus 10 shown in FIG. 1, which extends from a load lock chamber to a processing chamber, according to an embodiment of the present invention. As shown in FIGS. 1 and 2, the substrate processing apparatus 10 includes, for example, a transfer chamber 12, load lock chambers 14a and 14b, and two processing chambers 16a and 16b, wherein the transfer chamber 12 is centered among the load lock chambers 14a and 14b and the processing chambers 16a and 16b. Disposed upstream of the load lock chambers 14a and 14b are a front opening unified pod (FOUP: a carrier) such as a cassette, and an atmospheric transfer chamber 20 which serves as an equipment front end module (EFEM) for transferring a substrate between the load lock chambers 14a and 14b. At the atmospheric transfer chamber 20 are disposed three FOUPs (not shown) capable of accommodating, for example, twenty-five substrates 22 arranged at a regular distance in a longitudinal direction. Also, an atmospheric robot (not shown), configured to transfer a plurality of substrates 22 (for example, five substrates) between the atmospheric transfer chamber 20 and the load lock chambers 14a and 14b, are disposed in the atmospheric transfer chamber 20. The transfer chamber 12, the load lock chambers 14a and 14b and the processing chambers 16a and 16b are accommodated in a container (referred to as an apparatus body) that is formed as a single body with a material, for example, aluminum (A5052).

Also, the load lock chambers 14a and 14b, having the same configuration, are disposed such that the positions of load lock chambers 14a and 14b are symmetric with respect to an axis extending from the load lock chambers 14a and 14b to the processing chambers 16a and 16b. Likewise, the processing chambers 16a and 16b, having the same configuration, are disposed such that the positions of the processing chambers 16a and 16b are symmetric with respect to the above-mentioned axis. Hereinafter, the description will be given mainly about the load lock chamber 14a and the processing chamber 16a.

As shown in FIG. 2, inside of the load lock chamber 14a is disposed a substrate support (a boat) 24 configured to accommodate a plurality of substrates 22 (for example, twenty-five wafers) arranged at a regular distance in a longitudinal direction. The substrate support 24 is made of, for example, silicon carbide, and includes an upper plate 24c; a lower plate 24d; and a plurality of posts (for example, three posts) 24a connecting the upper plate 24c and the lower plate 24d. A plurality of (for example, twenty-five) mounting units (horizontal grooves) 24b configured to support the substrates 22 in a parallel manner are arranged inside the posts 24a in a length direction. Also, the substrate support 24 is configured to rotate about a vertically extending rotation axis while moving in a vertical direction (in an up-down direction) in the load lock chamber 14a. As the substrate support 24 moves in a vertical direction, two of the substrates 22 are transferred together from a finger pair 38 to be described later to an upper surface of the mounting unit 24b installed at each of the three posts 24a in the substrate support 24. Also, as the substrate support 24 moves in a vertical direction, two of the substrates 22 are transferred together from the substrate support 24 to the finger pair 38.

As shown in FIG. 2, a vacuum robot 36 configured to transfer the substrates 22 between the load lock chamber 14a and the processing chamber 16a is installed in the transfer chamber 12. The vacuum robot 36 includes an arm 37 having the finger pair 38 including an upper finger 38a and a lower finger 38b. For example, the upper finger 38a and the lower finger 38b have the same shape, are spaced apart at a predetermined distance in the up-down direction. Further, each of the upper and the lower finger 38a and 38b extends from the arm 37 in a substantially same horizontal direction so as to support each of the substrates 22 at the same time. The arm 37 is configured to rotate about a vertically extending rotation axis and move in a horizontal direction to be able to transfer two of the substrates 22 at the same time.

As shown in FIG. 2, a light receiving chamber 50 to be described later is installed in the processing chamber 16a. Substrate support units 44a and 44b are installed in the light receiving chamber 50. A space between the substrate support unit 44a and the substrate support unit 44b is partially partitioned horizontally by a partition member 48. Two of the substrates 22, loaded into the processing chamber 16a via the vacuum robot 36, are placed on the substrate support units 44a and 44b, respectively, and then heat-treated in the light receiving chamber 50. A substrate processing process including the heat treatment will be described later.

Figure 3:
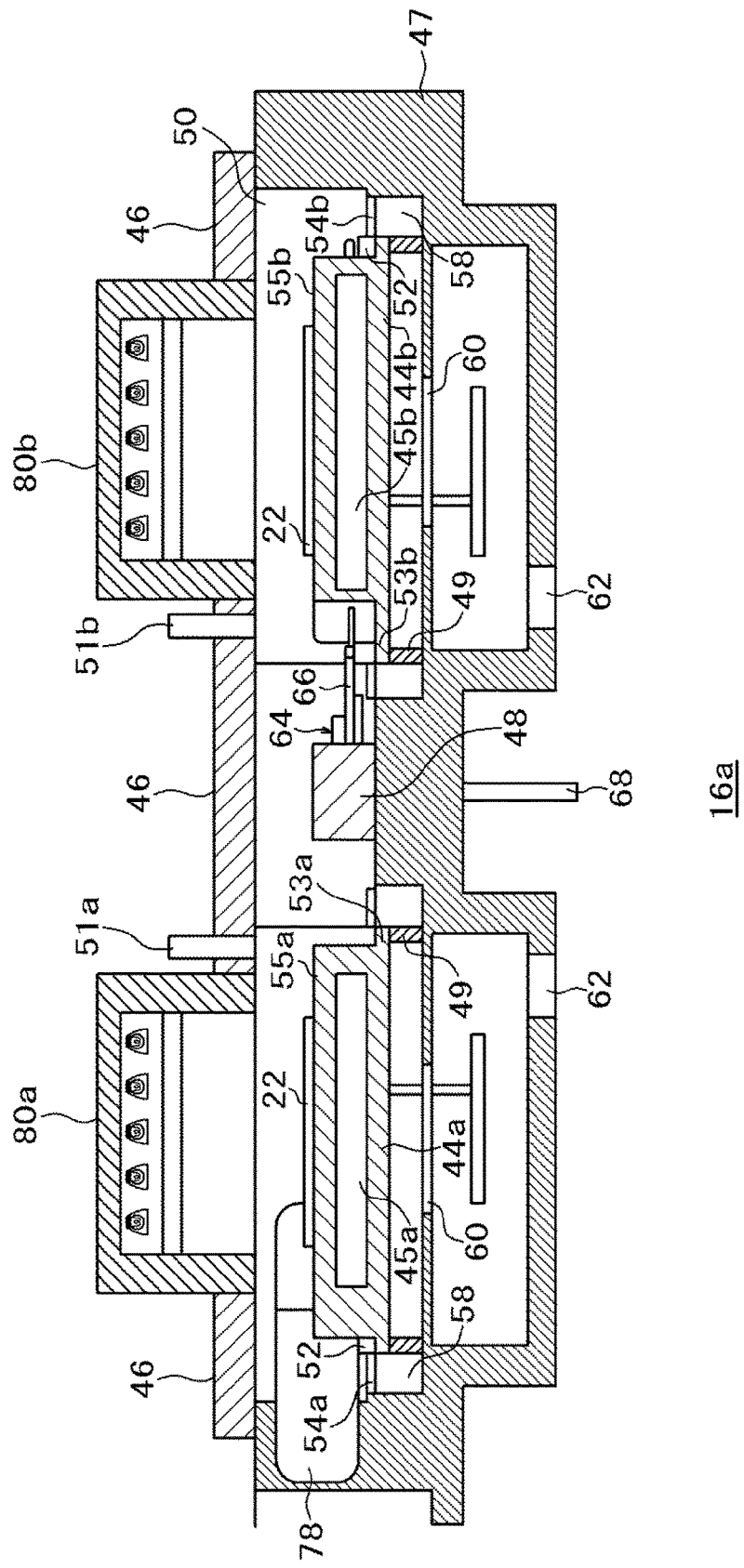
FIG. 3 is a vertical cross-sectional view showing an outline of the processing chamber according to an embodiment of the present invention.
Figure 4:
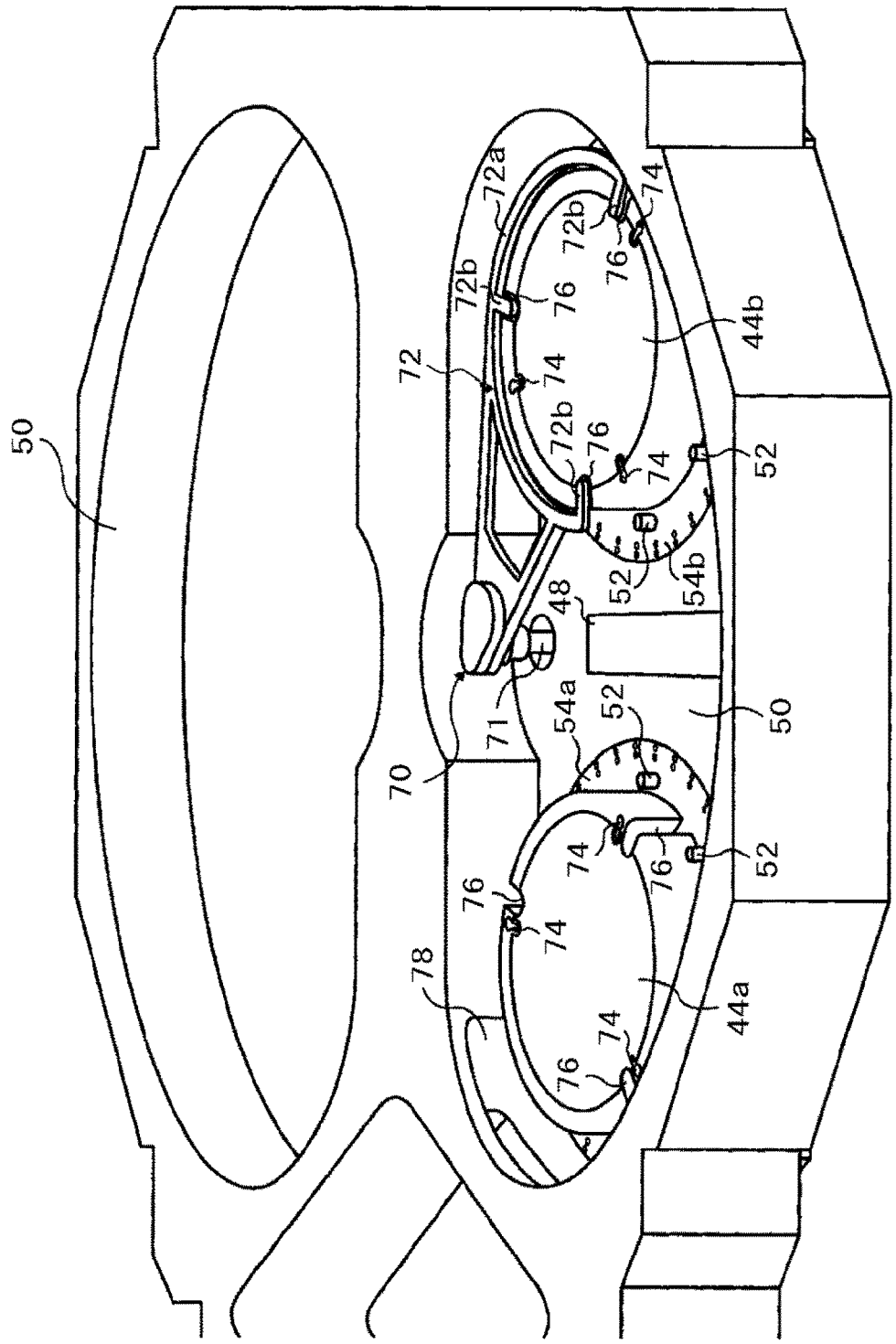
FIG. 4 is a perspective view showing an outline of the processing chamber according to an embodiment of the present invention.
Figure 5:
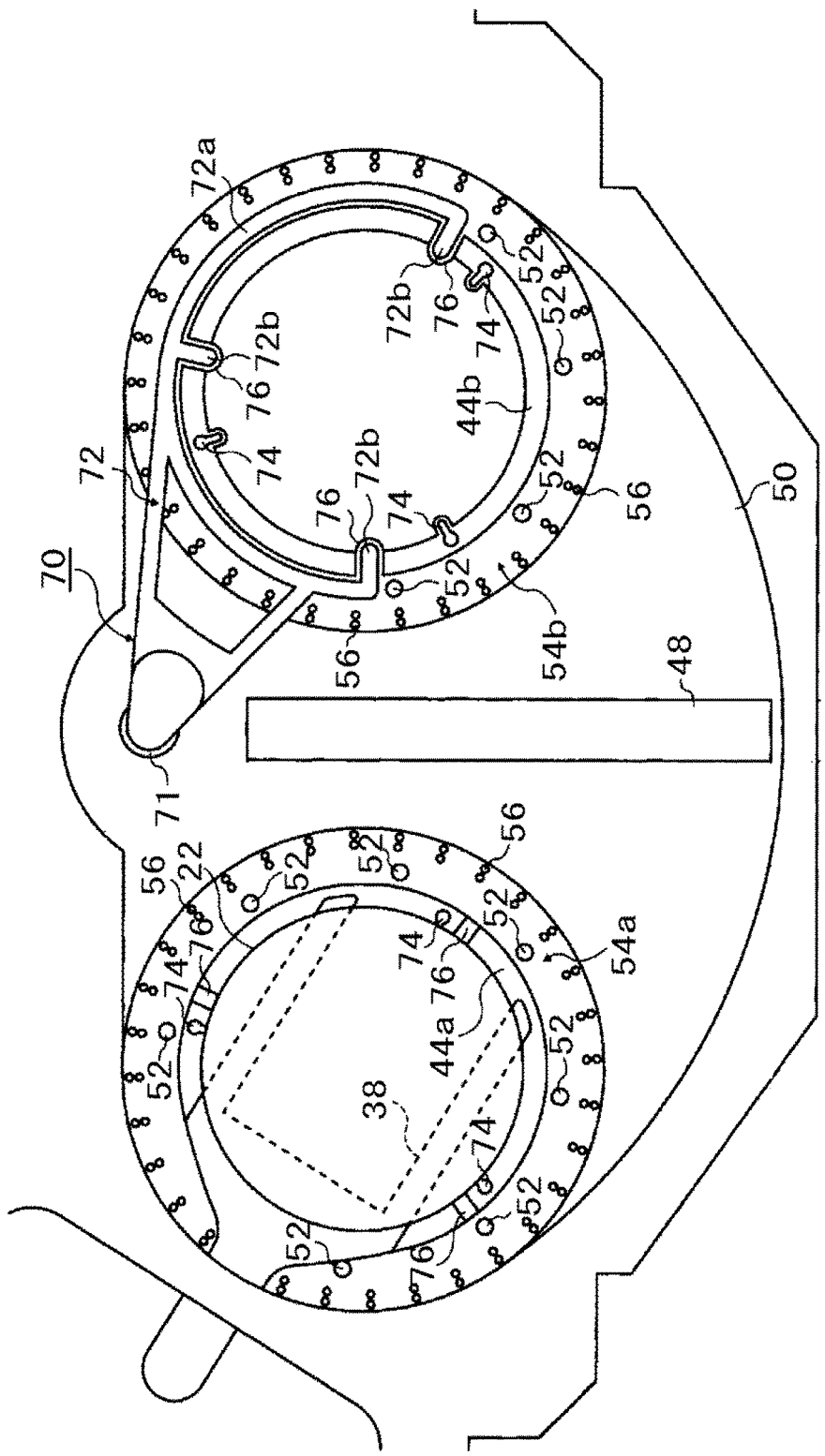
FIG. 5 is a top view showing an outline of the processing chamber according to an embodiment of the present invention.

FIGS. 3 to 5 show an outline of the processing chamber 16a. As shown in FIG. 3, a lower part (a bottom portion and a lateral portion) of the processing chamber 16a is defined by a lower container 47. The lower container 47 constitutes a part of the above-described apparatus body formed as a single body with aluminum. An upper opening of the processing chamber 16a is closed by a lid 46 installed at an upper portion of the lower container 47. Further, openings are formed in the lid 46 at positions corresponding to the substrate support units 44a and 44b. Lamp housings 80a and 80b, constituting a heating unit, are installed respectively in the openings. Configurations of the lamp housings 80a and 80b will be described later. In this manner, a contour of the processing chamber 16a is formed by the lower container 47, the lid 46 and the lamp housings 80a and 80b. Also, the light receiving chamber 50 (referred to as a processing space) is disposed below the lid 46 and the lamp housings 80a and 80b and above the substrate support units 44a and 44b. As will be described later, a desired treatment is performed on the substrates supported by the substrate support unit in the light receiving chamber 50.

In the vicinity of the lamp housings 80a and 80b, gas supply units 51a and 51b are installed at the lid 46 at positions corresponding to the substrate support units 44a and 44b. Downstream ends of gas supply pipes (not shown) are respectively connected to upstream ends (upper ends in the drawing) of the gas supply units 51a and 51b. Installed at the gas supply pipe are a gas supply source (not shown) configured to supply an inert gas such as $N_2$ gas or a rare gas (e.g., Ar gas, He gas) or other processing gases; a mass flow controller constituting a flow controlling unit; and an opening/closing valve, which are arranged in this sequence from upstream. Thus, a gas can be supplied from each of the gas supply units 51a and 51b to the light receiving chamber 50. Also, the inside of the light receiving chamber 50 can be vacuum pumped by a pump (not shown) to a level of, for example, 0.1 Pa via a first exhaust port 56, a second exhaust port 60 and a third exhaust port 62 to be described later.

As described above, the substrate support units 44a and 44b are disposed separately in a single space in the light receiving chamber 50 below the lamp housings 80a and 80b, respectively. The substrate support units 44a and 44b are formed in a disc shape. Flanges 53a and 53b are installed at lower ones of main surfaces of the substrate support units 44a and 44b, respectively. The posts 49 vertically installed at the lower container 47 are connected to lower surfaces of the flanges 53a and 53b. The substrate support units 44a and 44b are fixed at side portions thereof by fixing members 52 while being supported by the posts 49.

Substrate support surfaces 55a and 55b for supporting the substrates 22 in a horizontal posture are installed at upper ones of the main surfaces (i.e., surfaces facing the lamp housings 80a and 80b) of the substrate support units 44a and 44b, respectively. Each of the substrate support surfaces 55a and 55b has a height lower than an inner height of the light receiving chamber 50. Also, heaters 45a and 45b constituting a heating unit are installed in the substrate support units 44a and 44b, and is configured to heat the substrates 22 placed on the substrate support surfaces 55a and 55b to a temperature of, for example, 300° C. Each of the substrate support units 44a and 44b is formed of, for example, aluminum (A5052 or A5056). By forming the substrate support units 44a and 44b with a material having a high thermal conductivity such as aluminum, heat can be effectively conducted to the substrate 22. Also, the substrate support units 44a and 44b can be formed of, for example, a nonmetallic heat-resistant material such as quartz or alumina. In this case, metal contamination of the substrate 22 can be prevented.

The partition member 48 is disposed between the substrate support unit 44a and the substrate support unit 44b. The partition member 48 is formed of, for example, aluminum (A5052, A5056, etc.), quartz or alumina, and is configured by, for example, a prism-shaped member installed detachably at the lower container 47.

Exhaust baffle rings 54a and 54b are disposed at a periphery of the substrate support units 44a and 44b so as to surround an outer circumference of each of the substrate support units 44a and 44b (see FIG. 4). A plurality of holes (first exhaust ports) 56 are formed in the exhaust baffle rings 54a and 54b in a circumferential direction (see FIG. 5). First exhaust spaces 58 are formed below the substrate support units 44a and 44b and the exhaust baffle rings 54a and 54b (see FIG. 3). The first exhaust spaces 58 communicate with a space below the light receiving chamber 50 via second exhaust ports 60 installed below the substrate support units 44a and 44b. The lower space of the light receiving chamber 50 can be evacuated by a vacuum pump (not shown) via third exhaust ports 62 formed at the lower container 47.

Therefore, when a gas supplied into the light receiving chamber 50 is exhausted from the gas supply units 51a and 51b, the gas is first supplied onto the substrates 22 supported by the substrate support units 44a and 44b, and then exhausted toward the first exhaust space 58 via the holes 56 installed at the exhaust baffle rings 54a and 54b. Next, the gas in the exhaust space 58 is exhausted downward from the light receiving chamber 50 via the second exhaust ports 60 installed below the substrate support units 44a and 44b, and then exhausted out of the processing chamber 16a via the third exhaust ports 62 formed in the lower container 47.

As shown in FIGS. 4 and 5, a robot arm 70 capable of transferring the substrates 22 is disposed at one end side of the partition member 48. The robot arm 70 is configured to transfer one of the two of the substrates 22, which has been transferred by the arm 37, toward the substrate support unit 44b and retract it from the substrate support unit 44b. The robot arm 70 includes a finger 72 (a base portion of the finger 72 is made of a metal so as to adjust a position or a level) made of, for example, an alumina ceramic (degree of purity of 99.6% or higher); and a shaft portion 71. A biaxial driving unit (not shown) configured to rotate and elevate is installed at the shaft portion 71. The finger 72 includes an arc-shaped portion 72a having a larger diameter than that of the substrate 22, and three protrusions 72b extending toward the center from the arc-shaped portion 72a are formed at predetermined distances. When the light receiving chamber 50 is kept under vacuum, the shaft portion 71 is configured to be isolated from an atmosphere by a water-cooled magnetic seal. Also, the partition member 48 and the robot arm 70 are disposed inside the light receiving chamber 50 such that the space in the light receiving chamber 50 is not divided into completely separated spaces.

Figure 6:
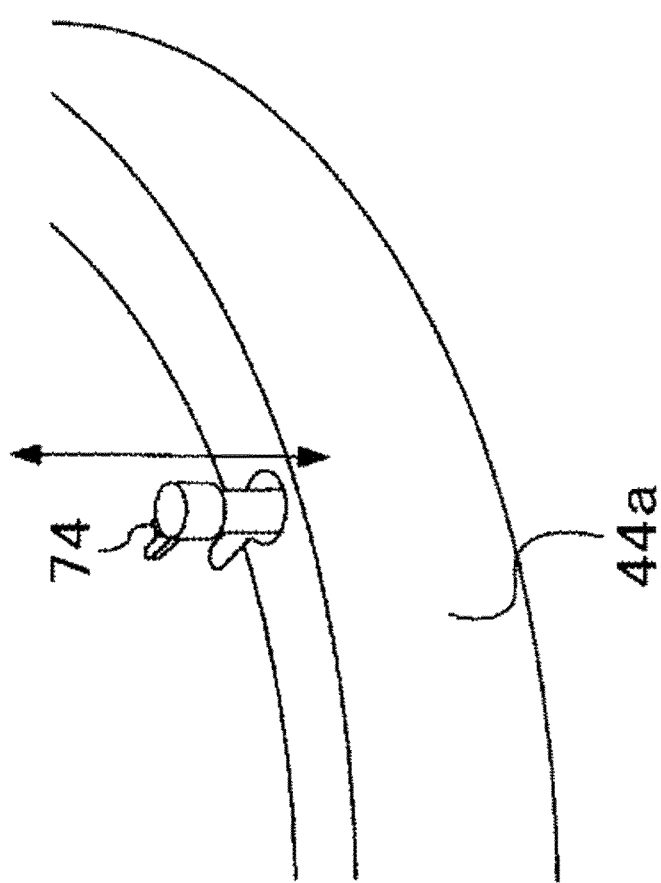
FIG. 6 is a perspective view showing an operation of a substrate holding pin according to an embodiment of the present invention.

At least three substrate holding pins 74 as shown in FIG. 6 pass through the substrate support units 44a and 44b in a vertical direction. The substrates 22 transferred from the inside of the transfer chamber 12 into the processing chamber 16a via the vacuum robot 36 are temporarily placed on the substrate holding pins 74. The substrate holding pins 74 are configured to elevate in an up-down direction. As shown in FIG. 4 or 5, three grooves 76 formed in a longitudinal direction (an up-down direction) are also formed at each of the outer circumferences of the substrate support units 44a and 44b so that the protrusions 72b provided in the finger 72 can move from the top to the bottom with respect to the upper surfaces of the substrate support units 44a and 44b.

(Configuration of Lamp Housing)

Figure 7:
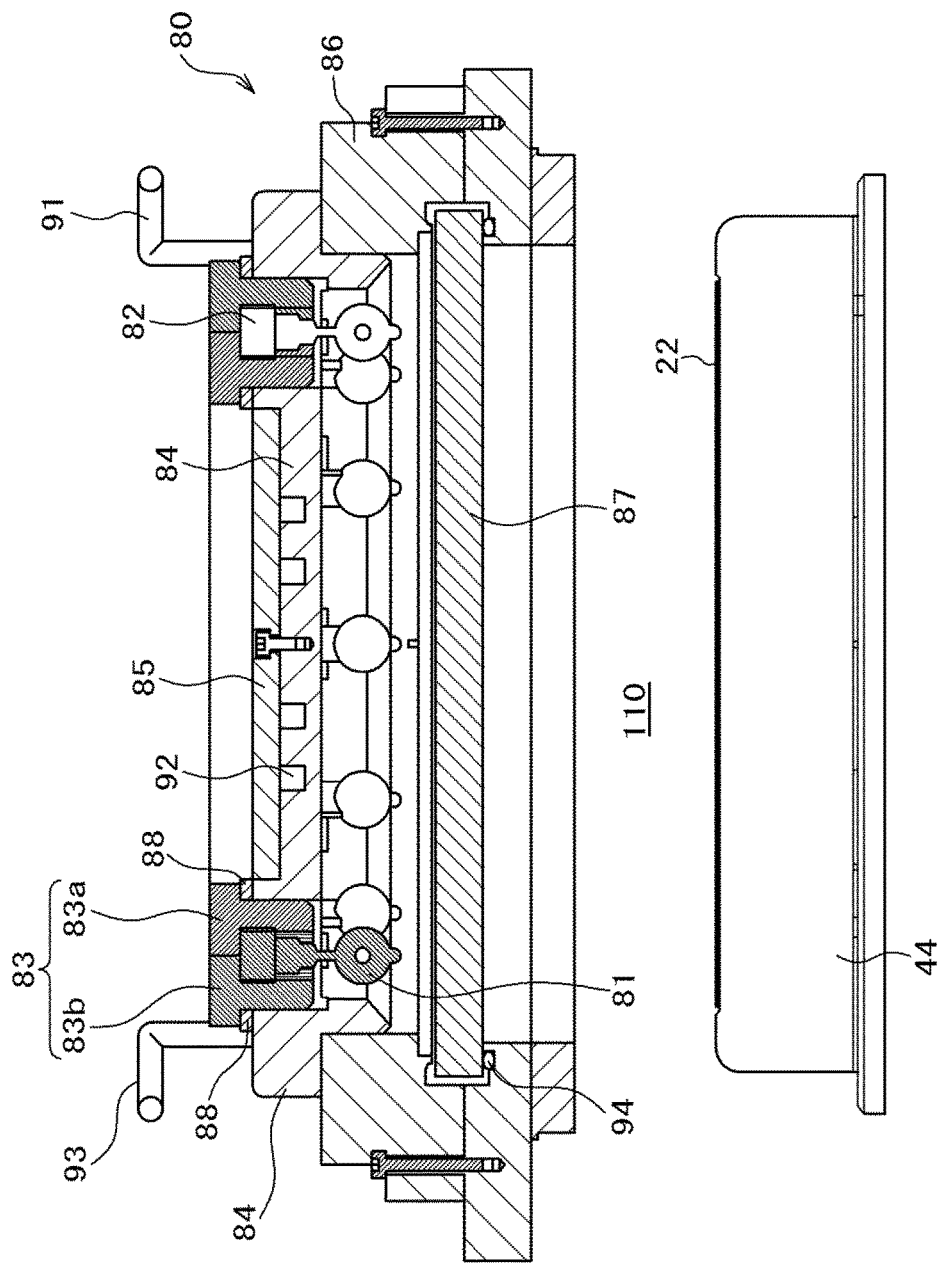
FIG. 7 is a vertical cross-sectional view showing an outline of a heating unit according to an embodiment of the present invention.
Figure 8:
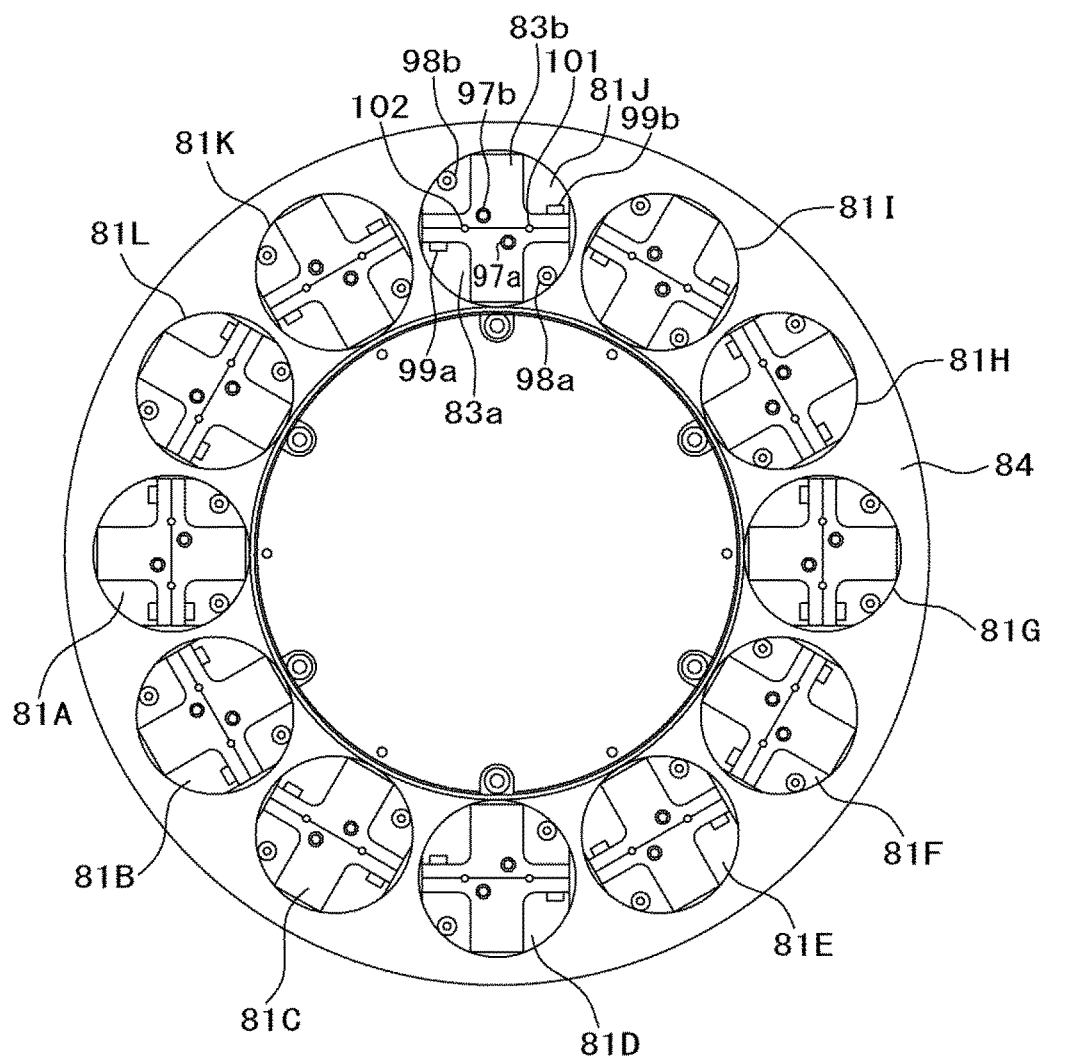
FIG. 8 is a top view showing an outline of the heating unit according to an embodiment of the present invention.
Figure 8:
Figure 9:
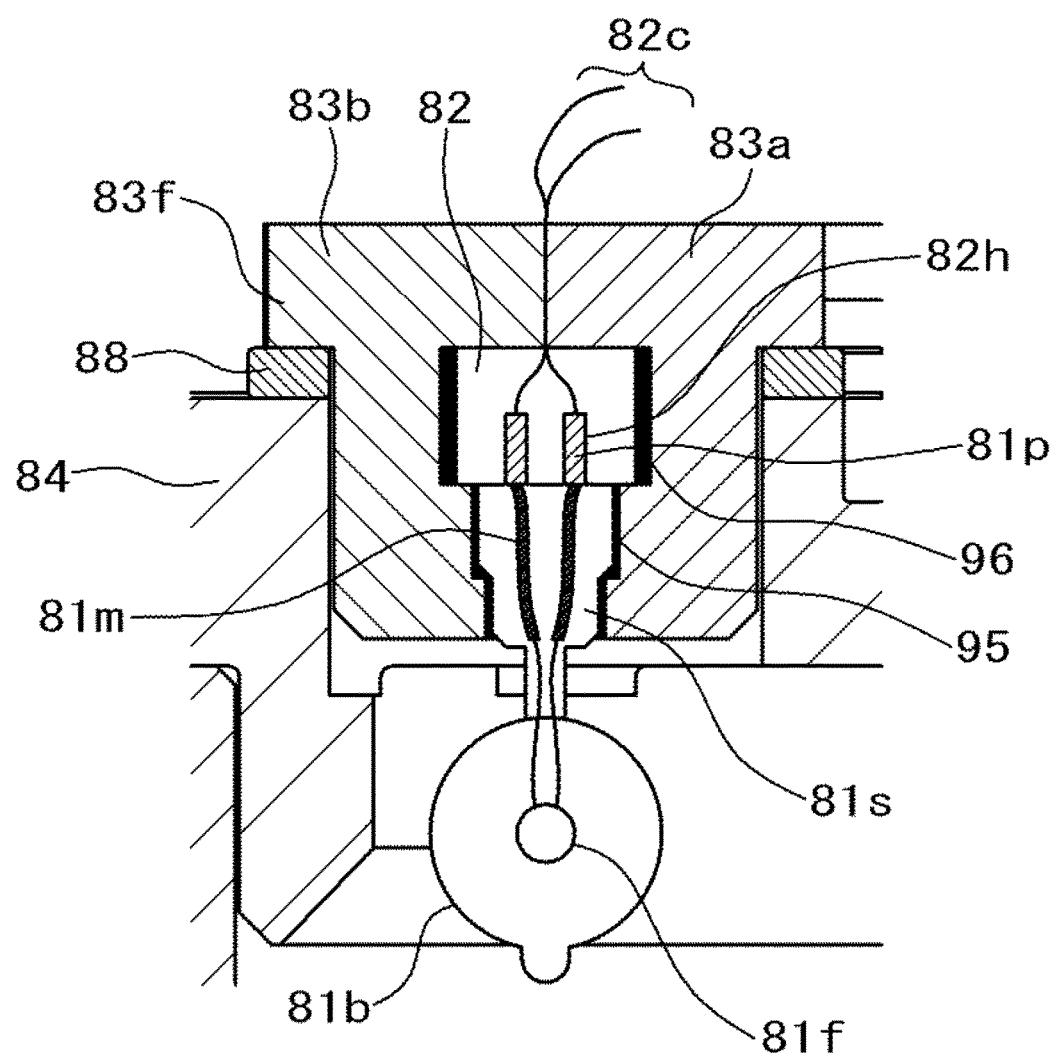
FIG. 9 is a partial enlarged view of FIG. 7.
Figure 10:
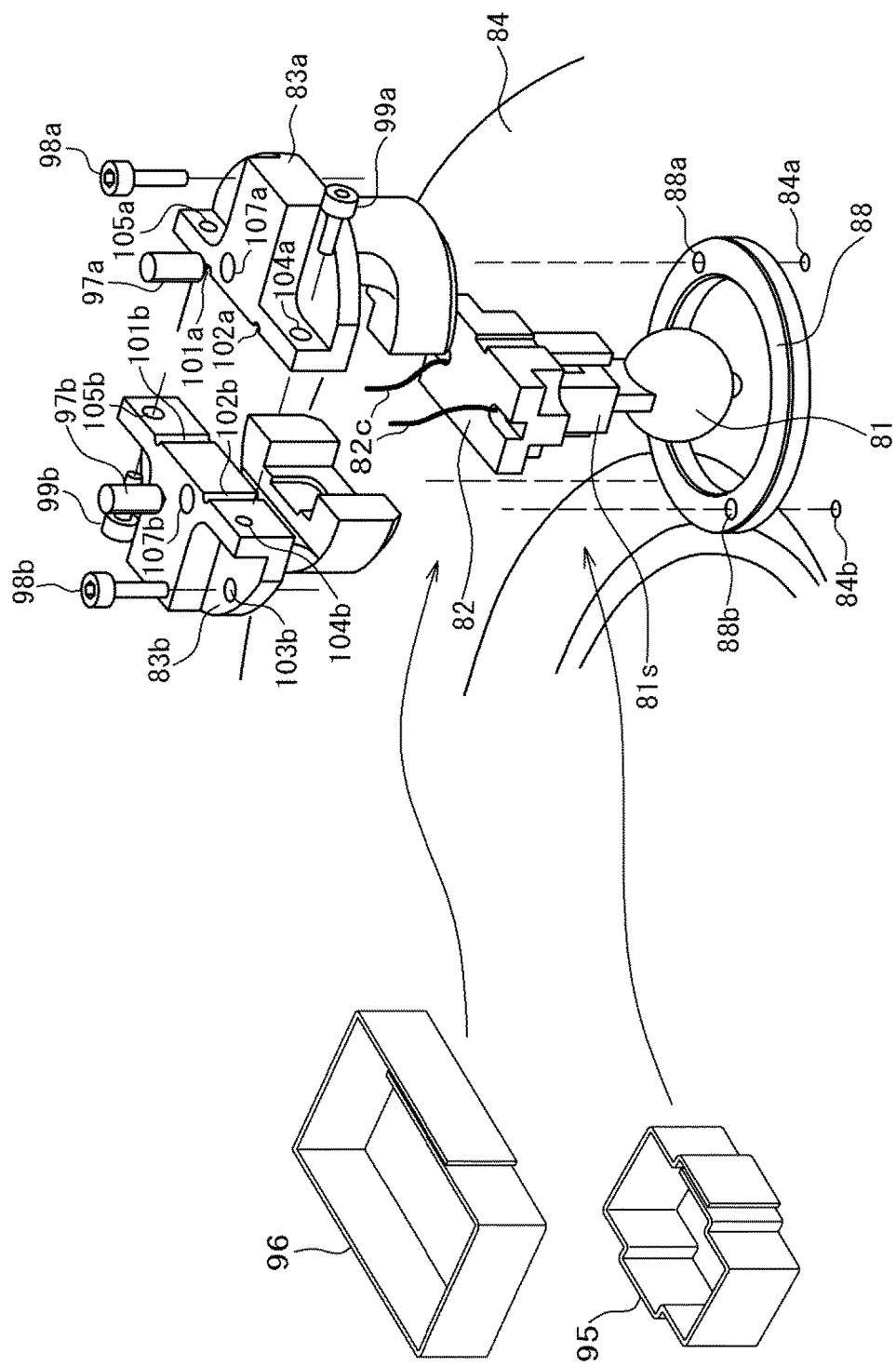
FIG. 10 is an exploded perspective view showing a structure of the heating unit according to an embodiment of the present invention.

Next, configurations of the lamp housings 80a and 80b constituting a heating unit according to this embodiment will be described with reference to FIGS. 7 to 10. Since the lamp housings 80a and 80b have the same configurations, the description will be given as to the lamp housing 80 instead of the lamp housings 80a and 80b. In the same manner, the description will be given as to the substrate support unit 44, the heater 45, and the block 83. FIG. 7 is a diagram of the lamp housing 80 and the substrate support unit 44 viewed from the side. FIG. 8 is a diagram of the lamp housing 80 viewed from above. FIG. 9 is a partial enlarged view of FIG. 7. FIG. 10 is an exploded perspective view showing a structure in which a lamp 81 is installed. The lamp 81 irradiates the substrates 22 supported by the substrate support unit 44 with light.

Each of the lamp housings 80a and 80b constituting a lamp receiving unit mainly includes a plurality of lamps 81 (81A to 81L); a socket 82 provided respectively corresponding to the lamps 81 for fixing the lamps 81; a block 83 covering the socket 82, respectively; a lamp base 84; a window 87; and a sidewall 86. The socket 82 is connected to the lamp 81, and constitutes a lamp connection member configured to supply an electric current to the lamp 81. The block 83 covers the socket 82 being in contact therewith or sealing part 81s, and constitutes a heat absorption member configured to absorb heat from the sealing part 81s. The lamp base 84 constitutes a base member fixing the block 83 being in contact therewith.

The socket 82 is formed of, for example, an insulating material such as ceramic, and the block 83, the lamp base 84 or the sidewall 86 is formed of, for example, a metal (for example, aluminum) having a higher thermal conductivity than that of the socket 82.

As shown in FIG. 7, the lamp base 84 is supported by the sidewall 86. Between the lamp base 84 and the processing space 110 is installed the window 87 isolating an atmosphere in the processing space 110 from an atmosphere of an inner space of the lamp housing 80 accommodating the lamp 81 formed therein is installed. The window 87 is fixed at the sidewall 86 via an O-ring 94. The window 87 may be formed of a material (for example, quartz) which does not reduce a level of light irradiated from the lamp 81. In this configuration, the lamp 81 can be safely and rapidly changed without affecting the atmosphere in the processing space 110 during maintenance work such as lamp replacement.

When the window 87 is taken off to change the lamp 81, the following problems may be caused. For example, it is necessary to wait for a time until the heater 45 installed inside the substrate support unit 44 is cooled. Further, since a pressure in the processing space 110 in the light receiving chamber 50 is returned to an atmospheric pressure in order to replace the lamp, the inside of the light receiving chamber 50 needs to be evacuated again. In this structure, it is not necessary to wait until the heater is cooled, and the light receiving chamber 50 does not need to be evacuated again. Therefore, a maintenance time can be saved.

A cooling channel 92 through which a refrigerant flows is installed inside the lamp base 84. A lid 85, which shuts off the cooling channel 92, is disposed on the lamp base 84. The lid 85 is configured to prevent leakage of the refrigerant. A refrigerant supply pipe 91 and a refrigerant discharge pipe 93 are connected to the cooling channel 92. The refrigerant flowing from a refrigerant source (not shown) is supplied through the refrigerant supply pipe 91 to the cooling channel 92, and is discharged through the refrigerant discharge pipe 93. In this configuration, the block 83 is cooled via the lamp base 84. By cooling the block 83, it becomes possible to cool the sealing part 81s, the socket 82 or a wire 82c installed at the socket 82, and thus the life span of the lamp 81 can be extended. The wire 82c is an external electrical wire configured to supply an electric current from outside the lamp housing 80 to the socket 82 (see FIG. 9).

As shown in FIG. 8, the lamps 81 are arranged in a circumferential shape. Each of the lamps 81 is connected to a controller 120 of the substrate processing apparatus 10 so that the lamps 81 can be independently controlled by the controller 120. The lamps 81 are managed in groups. For example, lamps 81A, 81D, 81G and 81J make up a first group, lamps 81B, 81E, 81H and 81K make up a second group, and lamps 81C, 81F, 81I and 81L make up a third group. The lamps of each group are arranged to be adjacent to each other, and an intensity of light irradiated onto the substrates 22 is adjusted by adjusting a light output of each group. The substrates 22 can be uniformly heated by adjusting an intensity of light output among the groups.

In order to uniformly irradiate the substrates 22, a diameter of a circle in which the lamps 81 are installed may satisfy the following relationship: Diameter of substrate to be processed>Diameter of lamp installation>Radius of substrate to be processed. Here, the expression "diameter of lamp installation" refers to a diameter of a circle connecting the centers of the lamps (81A to 81L).

Thereafter, an installation structure of the lamps 81 will be described. As shown in FIG. 9, the lamp 81 is, for example, a halogen light bulb. A halogen gas is contained in, for example, a bulb 81b that has a filament 81f therein and is made of, for example, quartz material. In order to seal the lamp and prevent leakage of the halogen gas, the lamp 81 includes a sealing part 81s made of quartz material and continuously extended from the bulb 81b made of quartz material. To increase a mechanical strength of the sealing part 81s, a quartz surface of the sealing part 81s may be, for example, covered by ceramic. The sealing part 81s has therein a molybdenum foil (a lamp electrical wire) 81m electrically connected to the filament 81f. The molybdenum foil 81m is electrically connected to a plug 81p installed to protrude from the sealing part 81s.

A socket hole 82h in which the plug 81p is to be inserted is formed at the socket 82, and the wire 82c is electrically connected to the socket hole 82h. When the plug 81p of the lamp 81 is inserted into the socket hole 82h as above, the lamp 81 and the socket 82 are electrically connected to each other. By supplying an electric current to the wire (external electrical wire) 82c by an external power source (not shown), the electric current is supplied to the lamp electrical wire of the lamp 81 via the socket (lamp connection member) 82. Also, although the socket 82 and the lamp 81 are electrically connected by means of the socket hole 82h and the plug 81p in this embodiment, the lamp 81 may be configured to be screwed into the socket 82 as in a domestic light bulb.

When an electric current flows through the filament 81f to turn on the lamp 81, a temperature of the sealing part 81s is increased by heat generation of the filament 81f. Molybdenum is formed into a thin foil to prevent quartz of the sealing part 81s from breaking due to a difference in a coefficient of thermal expansion of the quartz of the sealing part 81s and that of the molybdenum, and is able to be modified easily by thermal expansion of the quartz. As the molybdenum foil 81m is modified in shape by the thermal expansion of the quartz of the sealing part 81s, the quartz of the sealing part 81s is prevented from being broken.

However, since molybdenum is easily oxidized at a high temperature of 350° C. or more, the sealing part 81s may be broken due to volume expansion caused by oxidation. Breakage of the sealing part 81s due to heat and fusion cutting of a tungsten filament are main factors reducing the life span of a halogen light bulb. Therefore, increase in temperature of the sealing part 81s should be suppressed to increase the life span of the lamp 81.

Hereinafter, a structure for suppressing increase in temperature of the sealing part 81s will be described. The sealing part 81s made of quartz material, the socket 82 made of ceramic material, and the wire 82c installed at the socket 82 are covered by the block 83 made of aluminum material having a higher thermal conductivity than that of the ceramic material and the quartz material. The block 83 is buried from above into the lamp base 84 made of aluminum material. That is, the block 83 is fit and fixed into the lamp base 84 in a direction different from a direction extending from the processing space 110 to the lamp base 84, wherein the substrates are processed in the processing space 110. In this structure, heat in the sealing part 81s, the socket 82 or the wire 82c are easily conducted to the block 83, so that an increase in temperature of the sealing part 81s, the socket 82 or the wire 82c can be suppressed. An increase in temperature of the sealing part 81s can be suppressed by suppressing an increase in temperature of the socket 82 or the wire 82c.

Further, in the above-described structure, the block 83 attenuates or blocks off light irradiated from the lamp 81 onto the sealing part 81s, the socket 82 and the wire 82c. An increase in temperature of the sealing part 81s, the socket 82 or the wire 82c can be suppressed by installing the block 83 to attenuate or block off light irradiated from the lamp 81 onto the sealing part 81s, the socket 82 and the wire 82c.

As shown in FIG. 9, the block 83 includes a division block 83a and a division block 83b. According to the configuration in which the socket 82 is inserted between the division block 83a and the division block 83b, the sealing part 81s, the socket 82 and the wire 82c can be easily surrounded and covered by the block 83. Further, it becomes easy to implement a structure in which light irradiated from the lamp 81 onto the sealing part 81s, the socket 82 and the wire 82c is blocked off.

More particularly, a horizontally-oriented recessed portion is formed in or near a vertically central portion in each of the division block 83a and the division block 83b. As shown in FIG. 9, by fitting the division block 83a with the division block 83b, a first space in the block 83 is defined by the recessed portions of the division blocks 83a and 83b. The socket 82 is configured to fit into the first space. As a result, an inner shape of the block 83 covering the socket 82 is substantially the same as an outer shape of the socket 82. Also, a second space is formed in the block 83 below the first space in a state where the division block 83a and the division block 83b are put together. The sealing part 81s is configured to fit into the second space. Thus, the inner shape of the block 83 covering the sealing part 81s is formed to be substantially the same as the outer shape of the sealing part 81s.

A heat conduction member 96 configured to conduct heat between the socket 82 and the block 83 is installed around the socket 82 (see FIG. 10). A thermal conductivity between the socket 82 and the block 83 is improved by inserting the heat conduction member 96 between the socket 82 and the block 83. A heat conduction member 95 configured to conduct heat between the sealing part 81s and the block 83 is installed around the sealing part 81s (see FIG. 10). A thermal conductivity between the sealing part 81s and the block 83 is improved by inserting the heat conduction member 95 between the sealing part 81s and the block 83.

The heat conduction member 95 and the heat conduction member 96 may include a material capable of being easily modified in shape and having a higher thermal conductivity than those of the socket 82 and the sealing part 81s. For example, a tape made of aluminum material may be used as the heat conduction member 95 and the heat conduction member 96. When the tape made of aluminum material is used as the heat conduction members 95 and 96, the heat conduction members 95 and 96 can be easily formed by winding the tape made of aluminum material around peripheral surfaces of the sealing part 81s and the socket 82.

Next, an installation structure of the lamp 81 according to this embodiment will be described in further detail. As shown in FIG. 10, in a state where the plug 81p (shown in FIG. 9) of the sealing part 81s in the lamp 81 is inserted into the socket 82, the heat conduction member 95 such as a tape made of aluminum material is wound around a peripheral surface of the sealing part 81s, and the heat conduction member 96 such as a tape made of aluminum material is wound around a peripheral surface of the socket 82. The heat conduction members 95 and 96 such as tapes made of aluminum materials may conduct heat uniformly, and may be wound once or two or more times.

Subsequently, the wires 82c are disposed at recessed portions 101a and 101b configured to form a wire hole 101, and at recessed portions 102a and 102b configured to form a wire hole 102, respectively. Thereafter, the socket 82 and the sealing part 81s are inserted between the division block 83a and the division block 83b in a horizontal direction. In this state, screws 99a are screwed horizontally into the screw hole 104a formed at the division block 83a and the screw hole 104b formed at the division block 83b. Also, screws 99b are screwed into the screw hole 105a formed at the division block 83a and the screw hole 105b formed at the division block 83b. In this manner, the socket 82 and the sealing part 81s around which the tape made of aluminum material is wound are fixed to the block 83 in a state where heat can be conducted easily. Also, since a covered portion of the wire 82c is pressed into the block 83, the heat conducted from the filament 81f to the wire 82c is easily transferred to the block 83.

Then, a screw 98a is vertically inserted through a screw hole 103a (not shown) formed at the division block 83a and a screw hole 88a formed at a height adjustment block 88 to be screwed into a screw hole 84a formed at the lamp base 84. Also, a screw 98b is vertically inserted through a screw hole 103b formed at the division block 83b and a screw hole 88b formed at the height adjustment block 88 to be screwed into a screw hole 84b formed at the lamp base 84. In this manner, the block 83 is fixed to the lamp base 84 via the height adjustment block 88.

Also, a spring plunger 97a is fixed into a plunger hole 107a formed vertically at the division block 83a, and a spring plunger 97b is fixed into a plunger hole 107b formed vertically at the division block 83b. Each of the spring plungers 97a and 97b has therein a pressing unit biased downward by an elastic member, for example, a spring. The pressing unit presses the socket 82 downward. Since a bottom portion of the socket 82 is strongly upwardly forced to contact the block 83 at a lower part of the first space in the block 83 (see FIG. 9), thermal conductivity between the socket 82 and the block 83 is further improved.

As shown in FIG. 9, the height adjustment block 88 is disposed between the lamp base 84 and a flange portion (a horizontal protrusion) 83f disposed at an upper portion of the block 83. The height adjustment block 88 is a spacer configured to adjust a height of the lamp 81 relative to the substrate support unit 44, and is made of, for example, aluminum material. Here, the height adjustment block 88 is optionally used when necessary. Variation in heights among individual lamps may be moderated by the height adjustment block 88. Further, by using the height adjustment block 88, the heat of the block 83 is easily conducted to the lamp base 84 because the height adjustment block 88 is made of aluminum material. Accordingly, the cooling efficiency of the lamp is improved.

(Method of Processing Substrate)

Figure 11:
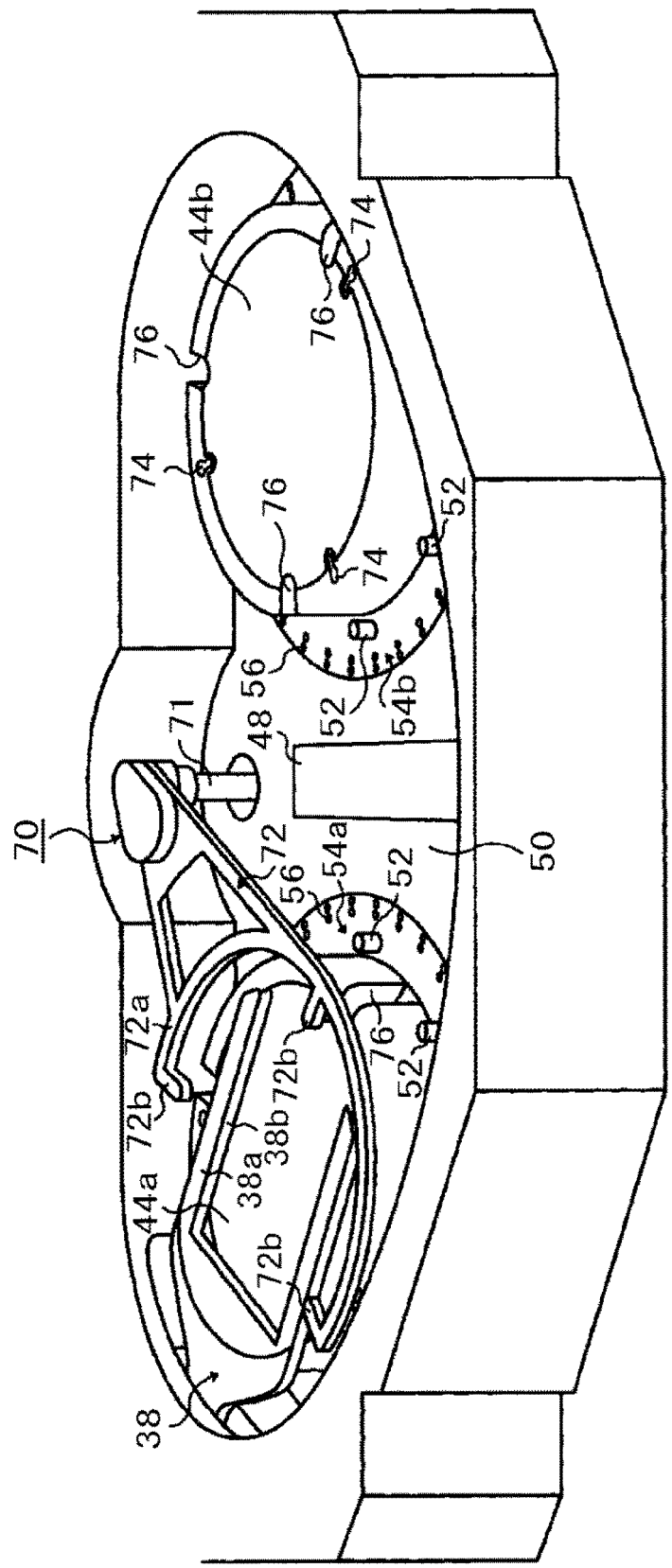
Figure 12:
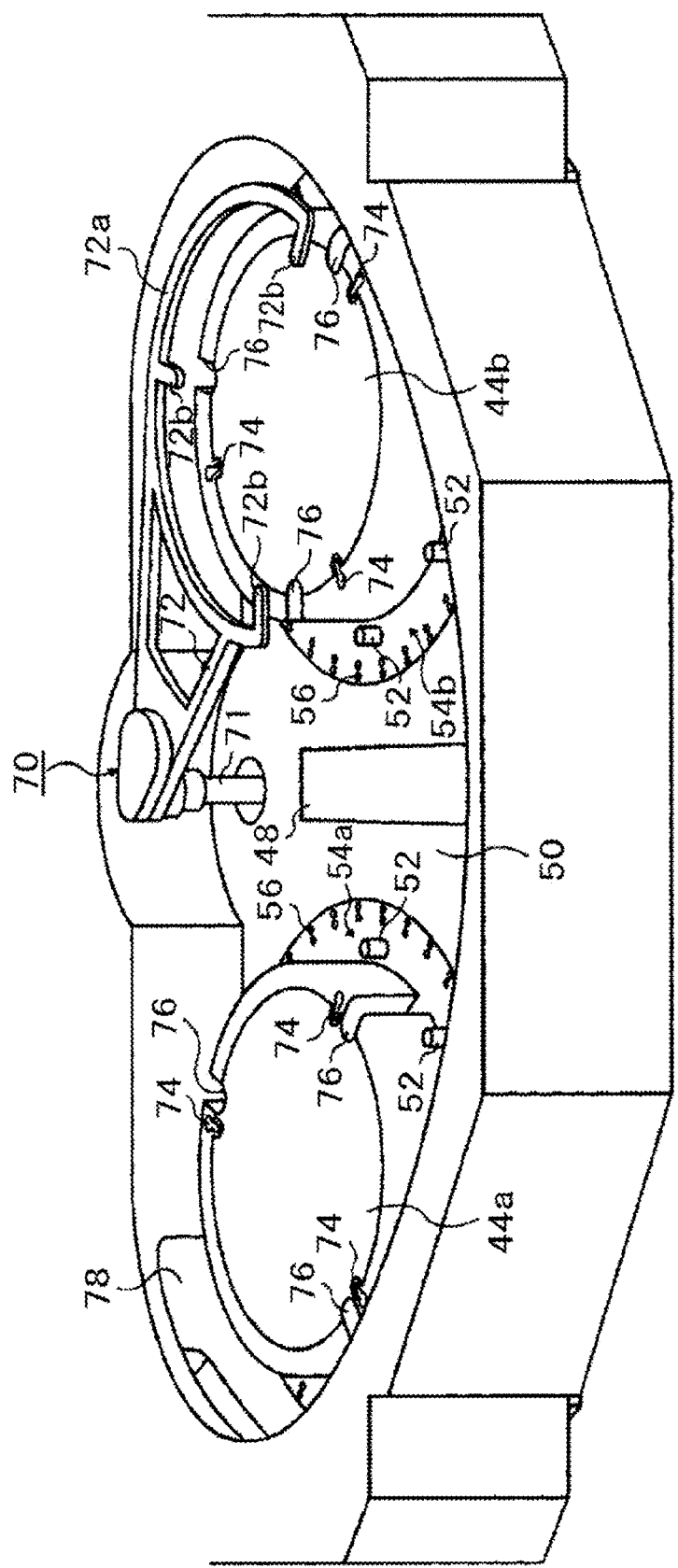
Figure 13:
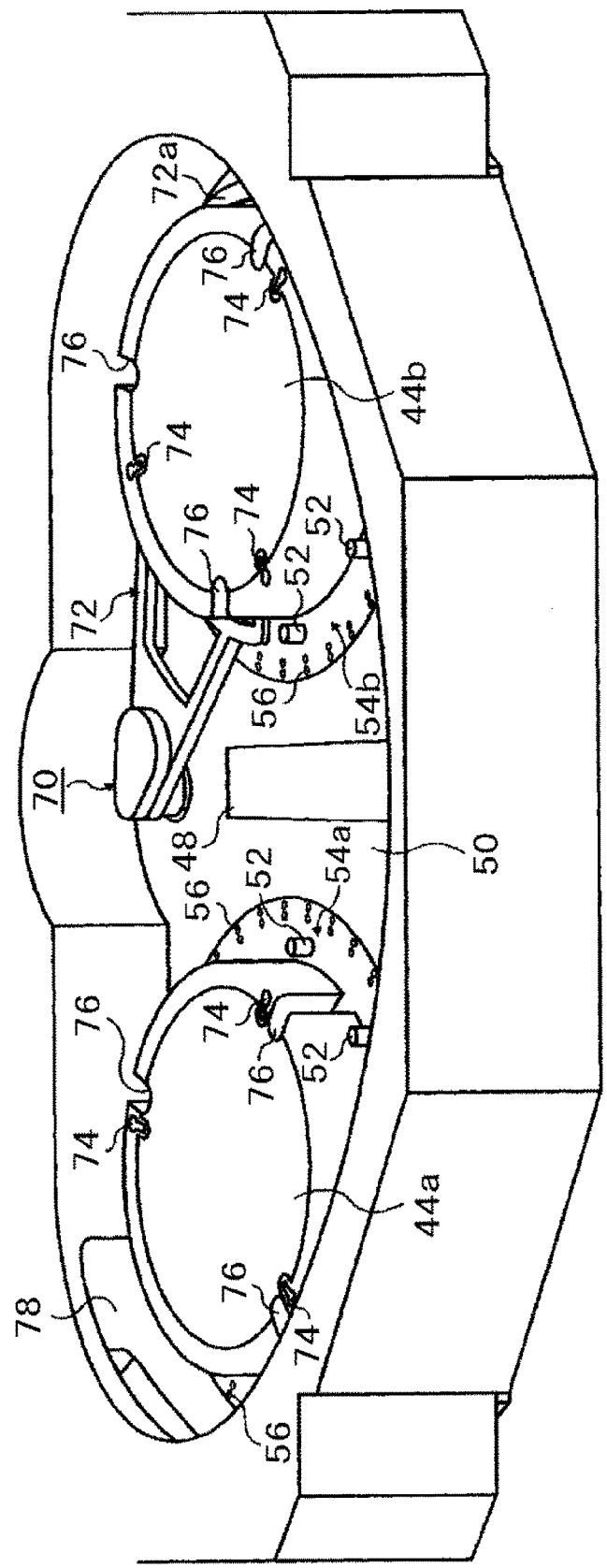

Next, operation of the robot arm 70 to transfer the substrates 22, and a method of processing a substrate which is a process in a method of manufacturing a semiconductor device according to this embodiment will be described with reference to FIGS. 11 to 13. FIGS. 11 to 13 show a process in which the robot arm 70 transfers the substrates 22. To clearly illustrate operation of the robot arm 70, the substrates 22 are not shown in FIGS. 11 to 13. First, as shown in FIG. 11, each of the upper finger 38a and the lower finger 38b of the finger pair 38 of the vacuum robot 36 transfers substrates from the transfer chamber 12 into the light receiving chamber 50 (transfers two substrates 22 at the same time), and stops at an upper portion of the substrate support unit 44a. In this case, the finger 72 of the robot arm 70 is on standby so that the finger 72 can be disposed between the two substrates 22 at the upper portion of the substrate support unit 44a.

Then, the robot arm 70 and three substrate holding pins 74 passing through the substrate support unit 44a move upward while the finger pair 38 is at a stop. Here, the substrate 22 placed on the lower finger 38b is transferred to the three substrate holding pins 74 passing through the substrate support unit 44a. Also, the substrate 22 placed on the upper finger 38a is transferred to the finger 72. The finger pair 38 by which the two substrates 22 are transferred is returned to the transfer chamber 12.

Subsequently, as shown in FIG. 12, the finger 72 moves toward an upper portion of the substrate support unit 44b as the shaft portion 71 of the robot arm 70 rotates. Then, as shown in FIG. 13, each of the protrusions 72b of the finger 72 moves from the top to the bottom along the grooves 76 of the substrate support unit 44b, and the substrates 22 are accommodated in the three substrate holding pins 74 passing through the substrate support unit 44b.

Thereafter, the finger 72 of the robot arm 70 moves to a lower position than that of the substrate support surface 55b. When the finger 72 of the robot arm 70 moves downward, the three substrate holding pins 74 passing through the substrate support unit 44a and the three substrate holding pins 74 passing through the substrate support unit 44b move downward, and the substrate 22 transferred by the lower finger 38b and the substrate 22 transferred by the upper finger 38a are placed respectively on the substrate support surfaces 55a and 55b at substantially the same timing. Also, the robot arm 70 is disposed in the light receiving chamber 50 during processing of the substrate 22 without impeding a downward flow of a gas supplied by the gas supply units 51a and 51b.

The substrates 22 placed on the substrate support surfaces 55a and 55b are irradiated with light from the lamp 81 so that the substrates 22 can be heated to a desired temperature, for example, a temperature of 470° C. A processing gas is supplied by the gas supply units 51a and 51b for heat treatment of the substrates. For example, nitrogen ($N_2$) gas is supplied as the processing gas. A predetermined heat treatment is carried out by heating the substrates 22 under an atmosphere of the supplied processing gas.

When the predetermined heat treatment is completed, the two substrates 22 are transferred from the inside of the light receiving chamber 50 to the transfer chamber 12. In this case, the robot arm 70 and the finger pair 38 perform operations in reverse order, which has been described with reference to FIGS. 11 to 13.

According to the embodiment of the present invention described above, at least the following effects (1) to (8) may be obtained.

(1) Because at least one of the lamp sealing part and the socket is covered and contacted by a block having a higher thermal conductivity than that of the lamp sealing part and the socket, an increase in temperature of the lamp sealing part can be suppressed, thereby increasing the life span of the lamp sealing part.

(2) Because the block comes in contact with a lamp base including a cooling channel, an increase in temperature of the lamp sealing part can be further suppressed.

(3) Because an external electrical wire of the socket is covered by the block so that the external electrical wire can come in contact with the block, an increase in temperature of the lamp sealing part can be further suppressed.

(4) Because a heat conduction member (for example, an aluminum foil) that can easily be modified in shape is sandwiched between the block and at least one of the lamp sealing part and the socket, an increase in temperature of the lamp sealing part can be further suppressed.

(5) Because the socket is pressed against the block by a spring, an increase in temperature of the lamp sealing part can be further suppressed.

(6) Because the block is disposed at the lamp base with a height adjustment block inserted therebetween, and the height adjustment block has a higher thermal conductivity than that of the lamp sealing part or the socket, an increase in temperature of the lamp sealing part can be further suppressed.

(7) Because the block includes a plurality of division blocks, it is easy to cover at least one of the lamp sealing part and the socket with the block. Also, it is easy to cover a wire of the socket with the block.

(8) Because the lamp sealing part, the socket, or the wire of the socket is covered by the block and not irradiated with light from the lamp, an increase in temperature of the lamp sealing part can be further suppressed.

Also, it is apparent that the present invention is not limited to the embodiments, and that various modifications and changes can be made without departing from the scope of the present invention. Although all of the lamp sealing part, the socket and the wire of the socket are covered by the block in the above embodiment, it is also possible to cover only one of the lamp sealing part, the socket and the wire of the socket with the block. Even in this case, an increase in temperature of the lamp sealing part can be suppressed to some extent. Further, although a substrate such as a wafer is processed in the above embodiment, an object to be processed may be, for example, a photomask, a printed circuit board, a liquid crystal panel, a compact disc or a magnetic disc.

At least the following configurations are included in description of this specification.

A first configuration provides a substrate processing apparatus including:

a light receiving chamber configured to process a substrate;

a substrate support unit disposed inside the light receiving chamber to support the substrate;

a lamp including a lamp electrical wire, and a sealing part accommodating the lamp electrical wire therein to hermetically seal the lamp with a gas therein, the lamp being configured to irradiate the substrate supported by the substrate support unit with a light;

a lamp receiving unit disposed outside the light receiving chamber to accommodate the lamp therein, the lamp receiving unit including a lamp connection member connected to the lamp to supply an electric current through the lamp electrical wire, a heat absorption member including a material having a thermal conductivity higher than that of the sealing part to cover the sealing part with the sealing part being in contact, and a base member fixing the heat absorption member with the heat absorption member being in contact; and an external electrical wire connected to the lamp connection member to supply an electric current to the lamp connection member.

A second configuration provides the substrate processing apparatus defined in the first configuration, wherein the heat absorption member includes the material having a higher thermal conductivity than that of the lamp connection member, and covers the lamp connection member with the lamp connection member being in contact.

A third configuration provides the substrate processing apparatus defined in the first or second configuration, wherein the lamp receiving unit includes a modifiable heat conduction member sandwiched between the sealing part and the heat absorption member, the heat conduction member including a material having a higher thermal conductivity than those of the sealing part and the lamp connection member.

A fourth configuration provides the substrate processing apparatus defined in the first to third configurations, wherein the base member has therein a cooling channel through which a refrigerant flows.

A fifth configuration provides the substrate processing apparatus defined in the first to fourth configurations, wherein the heat absorption member covers the external electrical wire is in contact with the external electrical wire.

A sixth configuration provides the substrate processing apparatus defined in the first to fifth configurations, wherein the lamp connection member is pressed against the heat absorption member by an elastic member.

A seventh configuration provides the substrate processing apparatus defined in the first to sixth configurations, wherein the heat absorption member includes a plurality of division blocks.

An eighth configuration provides the substrate processing apparatus defined in the first to seventh configurations, wherein the heat absorption member is configured to block the light from the lamp so as to prevent at least one of the sealing part and the lamp connection member from being irradiated with the light from the lamp.

A ninth configuration of the present invention provides a method of manufacturing a semiconductor device using a substrate processing apparatus comprising: a light receiving chamber configured to process a substrate; a substrate support unit disposed inside the light receiving chamber to support the substrate; a lamp including a lamp electrical wire, and a sealing part accommodating the lamp electrical wire therein to hermetically seal the lamp with a gas therein, the lamp being configured to irradiate the substrate supported by the substrate support unit with a light; a lamp receiving unit disposed outside the light receiving chamber to accommodate the lamp therein, the lamp receiving unit including a lamp connection member connected to the lamp to supply an electric current through the lamp electrical wire, a heat absorption member including a material having a thermal conductivity higher than that of the sealing part to cover the sealing part with the sealing part being in contact, and a base member fixing the heat absorption member with the heat absorption member being in contact; and an external electrical wire connected to the lamp connection member to supply an electric current to the lamp connection member, the method comprising:
loading the substrate into the light receiving chamber to be supported by the substrate support unit;
irradiating the substrate supported by the substrate support unit with the light from the lamp; and
unloading the substrate from inside the light receiving chamber.

What is claimed is:

1. A substrate processing apparatus comprising:
a light receiving chamber configured to process a substrate;
a substrate support unit disposed inside the light receiving chamber to support the substrate;
a lamp including: a lamp electrical wire; and a sealing part accommodating the lamp electrical wire therein to hermetically seal the lamp with a gas therein, the lamp being configured to irradiate the substrate supported by the substrate support unit with a light;
a lamp receiving unit disposed outside the light receiving chamber to accommodate the lamp therein, the lamp receiving unit including: a lamp connection member connected to the lamp to supply an electric current through the lamp electrical wire; a heat absorption member covering the sealing part to absorb heat from the sealing part, the heat absorption member including a material having a thermal conductivity higher than that of the sealing part; and a base member fixing the heat absorption member, wherein the lamp connection member and the heat absorption member are inserted in the base member; and
an external electrical wire connected to the lamp connection member to supply an electric current to the lamp connection member,
wherein the sealing part of the lamp is covered by the heat absorption member, and
wherein the heat absorption member covers the external electrical wire and is in contact with the external electrical wire.

2. The substrate processing apparatus of claim 1, wherein the heat absorption member includes the material having a thermal conductivity higher than that of the lamp connection member, the heat absorption member covering and absorbing heat from the lamp connection member.

3. The substrate processing apparatus of claim 1, further comprising a heat conduction member sandwiched between the sealing part and the heat absorption member, the heat conduction member including a material having a thermal conductivity higher than that of the sealing part.

4. The substrate processing apparatus of claim 1, wherein the lamp connection member is pressed against the heat absorption member by an elastic member.

5. The substrate processing apparatus of claim 1, wherein the heat absorption member is configured to block the light from the lamp so as to prevent at least one of the sealing part and the lamp connection member from being irradiated with the light from the lamp.

6. A method of manufacturing a semiconductor device using a substrate processing apparatus comprising: a light receiving chamber configured to process a substrate; a substrate support unit disposed inside the light receiving chamber to support the substrate; a lamp including a lamp electrical wire and a sealing part accommodating the lamp electrical wire therein to hermetically seal the lamp with a gas therein, the lamp being configured to irradiate the substrate supported by the substrate support unit with a light; a lamp receiving unit disposed outside the light receiving chamber to accommodate the lamp therein, the lamp receiving unit including a lamp connection member connected to the lamp to supply an electric current through the lamp electrical wire, a heat absorption member covering the sealing part to absorb heat from the sealing part, the heat absorption member including a material having a thermal conductivity higher than that of the sealing part and a base member fixing the heat absorption member, wherein the lamp connection member and the heat absorption member are inserted in the base member; and an external electrical wire connected to the lamp connection member to supply an electric current to the lamp connection member,
wherein the sealing part of the lamp is covered by the heat absorption member, and wherein the heat absorption member covers the external electrical wire and is in contact with the external electrical wire, the method comprising:
loading the substrate into the light receiving chamber to be supported by the substrate support unit;
irradiating the substrate supported by the substrate support unit with the light from the lamp; and
unloading the substrate from inside the light receiving chamber.

7. A substrate processing apparatus comprising:
a light receiving chamber configured to process a substrate;
a substrate support unit disposed inside the light receiving chamber to support the substrate;
a lamp including: a lamp electrical wire; and a sealing part accommodating the lamp electrical wire therein to hermetically seal the lamp with a gas therein, the lamp being configured to irradiate the substrate supported by the substrate support unit with a light;

a lamp connection member connecting the lamp electrical wire of the lamp and an external electrical wire configured to supply an electric current to the lamp electrical wire;

a heat absorption member covering the sealing part and the lamp connection member and configured to absorb heat from the sealing part and the lamp connection member; and a lamp receiving unit including a base member fixing the heat absorption member, wherein the lamp connection member and the heat absorption member are inserted in the base member, and wherein the heat absorption member, covering the sealing part and the lamp connection member with the lamp electrical wire in the sealing part and the external electrical wire in the lamp connection member electrically connected by having the sealing part and the lamp connection member inserted therein, is inserted into the lamp receiving unit from above the lamp receiving unit to be fixed to the lamp receiving unit by the base member.

8. The substrate processing apparatus of claim 7, wherein the heat absorption member includes a metal having a thermal conductivity higher than those of the sealing part and the lamp connection member.

9. The substrate processing apparatus of claim 7, further comprising a heat conduction member sandwiched between the sealing part and the heat absorption member, the heat conduction member including a material having a thermal conductivity higher than that of the sealing part.

10. The substrate processing apparatus of claim 9, wherein the heat absorption member comprises a plurality of divided blocks, and the sealing part and the lamp connection member are inserted in the divided blocks to be covered by the heat absorption.

11. The substrate processing apparatus of claim 10, wherein the heat absorption member is wound around the sealing part, and the heat absorption member is inserted in the plurality of divided blocks.

12. The substrate processing apparatus of claim 7, wherein the heat absorption member is configured to block the light from the lamp so as to prevent at least one of the sealing part and the lamp connection member from being irradiated with the light from the lamp.

* * * * *